(12) United States Patent
Mano et al.

(10) Patent No.: US 7,199,329 B2
(45) Date of Patent: Apr. 3, 2007

(54) METHOD OF SOLDERING SEMICONDUCTOR PART AND MOUNTED STRUCTURE OF SEMICONDUCTOR PART

(75) Inventors: Akihiro Mano, Niigata (JP); Yukihiro Ueno, Niigata (JP); Hironori Urasawa, Niigata (JP); Yuki Oishi, Niigata (JP); Tadashi Miyazaki, Niigata (JP)

(73) Assignee: Niigata Seimitsu Co., Ltd. (JP)

( * ) Notice: Subject to any disclaimer, the term of this patent is extended or adjusted under 35 U.S.C. 154(b) by 0 days.

(21) Appl. No.: 10/710,884

(22) Filed: Aug. 10, 2004

(65) Prior Publication Data

US 2005/0035184 A1 Feb. 17, 2005

(30) Foreign Application Priority Data

Aug. 11, 2003 (JP) ............................. 2003-291770

(51) Int. Cl.
*B23K 26/00* (2006.01)
*B23K 31/02* (2006.01)

(52) U.S. Cl. ................................ 219/121.66; 228/180.21
(58) Field of Classification Search ..................... None
See application file for complete search history.

(56) References Cited

U.S. PATENT DOCUMENTS 4,788,403 A * 11/1988 Hayakawa et al. ...... 219/85.12

| | | | | |
|---|---|---|---|---|
| 5,289,966 A * | 3/1994 | Izumi et al. | ............ | 228/180.21 |
| 5,763,854 A * | 6/1998 | Dittman et al. | ........ | 219/121.63 |
| 5,842,627 A * | 12/1998 | Takanashi et al. | ....... | 228/180.1 |
| 6,168,070 B1 * | 1/2001 | Sinkunas | ................. | 228/179.1 |
| 6,441,339 B1 * | 8/2002 | Ueno | ..................... | 219/121.65 |
| 6,583,385 B1 * | 6/2003 | Sinkunas et al. | ...... | 219/121.85 |
| 6,833,526 B2 * | 12/2004 | Sinkunas et al. | ...... | 219/121.66 |
| 7,069,653 B2 * | 7/2006 | Topp et al. | ................... | 29/854 |

FOREIGN PATENT DOCUMENTS

| | | | |
|---|---|---|---|
| DE | 3834147 A1 | * | 4/1990 |
| EP | 964608 A2 | * | 12/1999 |
| JP | 05-069182 | | 3/1993 |
| JP | 05-069182 A | * | 3/1993 |
| JP | 64015974 B | * | 3/1993 |
| JP | 10-041465 | | 2/1998 |
| JP | 10-229273 | | 8/1998 |
| JP | 2000-299239 | | 10/2000 |

* cited by examiner

*Primary Examiner*—Lynne R. Edmondson
(74) *Attorney, Agent, or Firm*—Connolly Bove Lodge & Hutz, LLP; Larry J. Hume

(57) ABSTRACT

A semiconductor part 1 in which a metal terminal 2 is formed on its back surface and side surface is mounted so that only the back surface portion of the metal terminal 2 is in contact with a cream solder 3. When the side surface portion of the metal terminal 2 is irradiated with laser beams, the back surface portion of the metal terminal 2 is heated by thermal conduction from the side surface portion to the back surface portion of the metal terminal 2 and the cream solder 3 in contact with the back surface portion of the metal terminal 2 is melted, whereby soldering is performed.

4 Claims, 2 Drawing Sheets

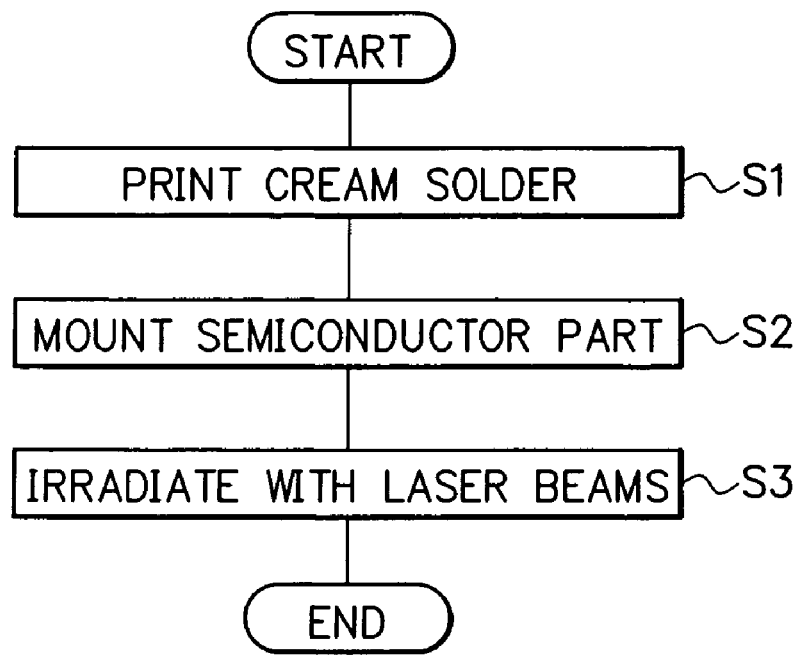
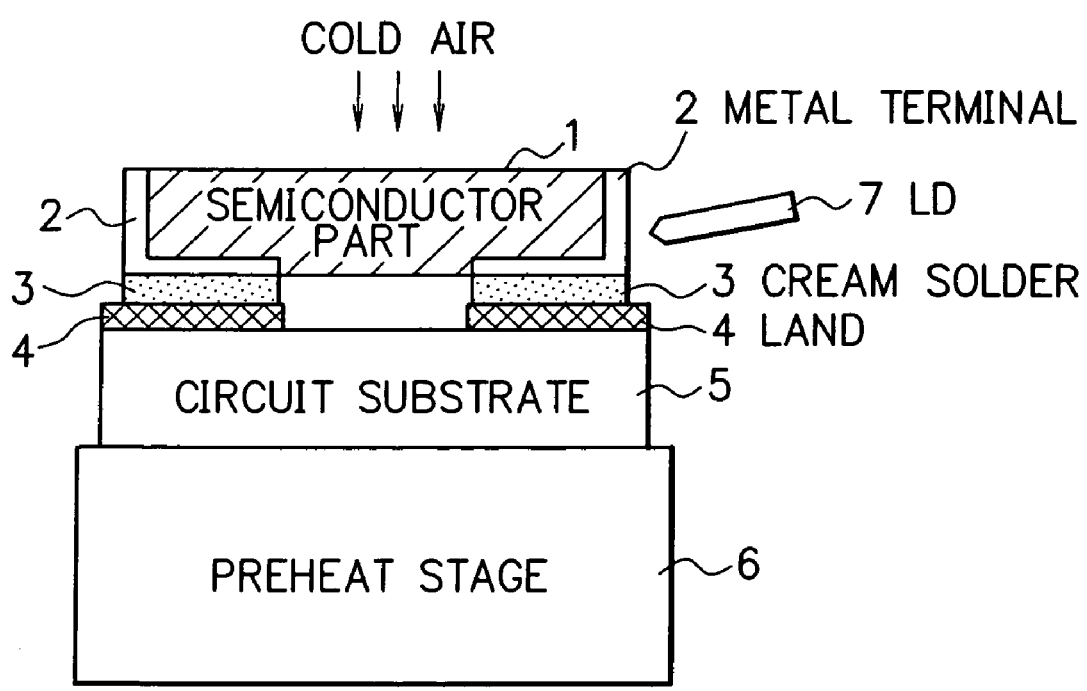

F I G. 3
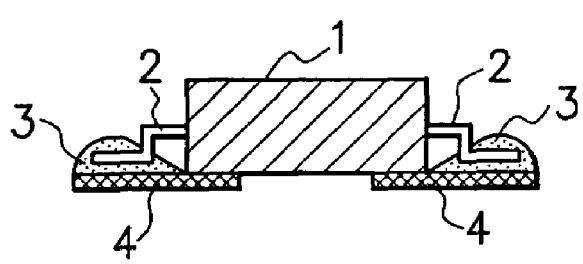 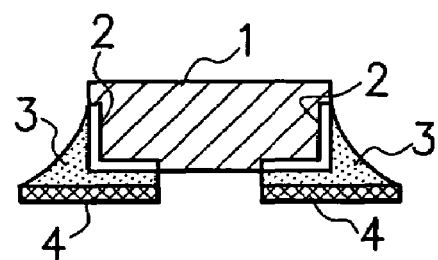
(a) PART PROVIDED WITH LEAD WIRES
(b) PART PROVIDED WITH NO LEAD WIRE

METHOD OF SOLDERING SEMICONDUCTOR PART AND MOUNTED STRUCTURE OF SEMICONDUCTOR PART

BACKGROUND OF THE INVENTION

1. Field of the Invention

The present invention relates to a method of soldering a semiconductor part and a mounted structure of a semiconductor part and, more particularly, to a method of soldering a semiconductor part which cannot be passed through a reflow furnace because of a low guaranteed heat resistant temperature onto a small land and a mounted structure of a semiconductor part which is formed by this method.

2. Description of the Related Art

In general, when a part such as a semiconductor package is soldered to a circuit board, as shown in FIG. 3, a semiconductor part 1 is disposed on a land 4 for soldering and a cream solder 3 is printed on this land 4. At this time, the cream solder 3 is printed so that an electrode 2 of the semiconductor part 1 is electrically connected to the land 4. And the circuit board on which the semiconductor part 1 is thus mounted is passed through a reflow furnace to cause the cream solder 3 to be melted in order to perform soldering (refer to, for example, Patent Document 1). [Patent Document 1] Japanese Patent Laid-Open No. 10-41465

In such a reflow fabrication process, to avoid a thermal fracture of the semiconductor part 1, it is necessary that the surface temperature of this semiconductor part 1 be not more than a guaranteed heat resistant temperature. For this reason, the reflow fabrication process had the disadvantage that much ancillary work has to be performed before and after reflow, for example, it is necessary to stick a heat resistant film to the semiconductor part 1 or apply resin to the semiconductor part 1 before the circuit board is passed through the reflow furnace, it is necessary to peel the heat resistant film after the circuit board is passed through the reflow furnace, and the like.

Incidentally, a thermal fracture of the semiconductor part 1 can be avoided by lowering the heating temperature in the reflow furnace to not more than a guaranteed heat resistant temperature of the semiconductor part 1. However, in order to ensure that the cream solder 3 is positively melted, it is necessary that the temperature of the land 4 be not less than a melting temperature of the solder. Therefore, in order to eliminate insufficient heating of the cream solder, there has been proposed a method by which a through via hole which is connected to an inner layer pattern or an outer layer pattern of a circuit board is connected directly to a land and the heat of a reflow furnace is collected to the land via the through via hole (refer to, for example, Patent Document 2). [Patent Document 2] Japanese Patent Laid-Open No. 10-229273

Incidentally, in some package structures, there are packages incapable of being passed through the reflow furnace because of their low guaranteed heat resistant temperatures. In this case, a soldering fabrication process by the local heating method is effective. As such processes, there is a hand soldering fabrication process which involves performing manual soldering using a wire solder by means of a soldering iron and a laser beam fabrication process which involves performing soldering by irradiating a cream solder with focused laser beams (for example, refer to Patent Documents 3 and 4). [Patent Document 3] Japanese Patent Laid-Open No. 5-69182; [Patent Document 4] Japanese Patent Laid-Open No. 2000-299239.

However, the hand soldering fabrication process has the disadvantage that not only man-hours increase much, but also the reliability of soldering is apt to generate variations according to the ability of workers. On the other hand, in the case of the laser beam fabrication process, man-hours are relatively small and the reliability of soldering scarcely generates variations according to the ability of workers. Therefore, in quite a number of cases, soldering has been performed by the laser beam fabrication method.

In recent years, however, to meet requirements for high functional design and small size and light weight design, progress has been made in high density design of semiconductor parts and there have been an increasing number of cases where the size of lands has to be reduced because the space of a circuit substrate decreases. When a land becomes small, it becomes impossible to ensure a sufficient land space around a semiconductor part to be mounted and only the area almost on the backside of the semiconductor part can be soldered.

SUMMARY OF THE INVENTION

The present invention is made in view of this situation and has as its object to ensure that in a case where a semiconductor part incapable of being passed through a reflow furnace because of a low guaranteed heat resistant temperature is to be mounted on a circuit substrate in high density, the semiconductor part can be positively soldered even onto a land which is so small that a solder can be printed only in a back side portion of the semiconductor part.

To solve the above-described problem, in the present invention, a semiconductor part in which a metal terminal is formed on its back surface and side surface is mounted on a land so that only the back surface portion of the metal terminal is in contact with a cream solder and the land and the semiconductor are soldered together by irradiating the side surface portion of the metal terminal with laser beams.

According to the present invention configured as described above, due to thermal conduction from a side surface portion of a metal terminal to a back surface portion of the metal terminal, the back surface portion of the metal terminal is heated and a cream solder in contact with the back surface portion of the metal terminal is melted, with the result that soldering is performed. As a result of this, in a case where a semiconductor part incapable of being passed through a reflow furnace because of a low guaranteed heat resistant temperature is to be mounted on a circuit substrate in high density, the semiconductor part can be positively soldered even on to a land which is so small that a solder can be printed only in a backside portion of the semiconductor part.

BRIEF DESCRIPTION OF THE DRAWINGS

FIG. 1 is a flow chart showing an outline of a method of soldering a semiconductor part according to this embodiment;

FIG. 2 is a drawing to show an mounted structure of a semiconductor part according to this embodiment; and FIG. 3 is a drawing to explain a conventional method of soldering a semiconductor.

DETAILED DESCRIPTION OF THE PREFERRED EMBODIMENTS

An embodiment of the present invention will be described on the basis of the drawings. FIG. 1 is a flow chart showing an outline of a method of soldering a semiconductor part according to this embodiment. FIG. 2 is a drawing to show a mounted structure of a semiconductor part according to this embodiment.

As shown in FIG. 1 and FIG. 2, first, a cream solder 3 is printed on a land 4 of a circuit substrate 5 (Step S1), and the circuit substrate 5 is placed on a preheat stage 6. Next, a semiconductor part 1 in which a metal terminal 2 is formed on its back surface and side surface is mounted on the land 4 on which the cream solder 3 is printed. At this time, the semiconductor part 1 is mounted on the land 4 so that almost all area of the land 4 is opposed to the mounting surface (back surface) of the semiconductor part 1 and only the back surface portion of the metal terminal 2 is in contact with the cream solder 3.

And, by use of a laser diode (LD) 7, for example, the solder joining of the semiconductor part 1 and the land 4 is performed by irradiating the side surface portion of the metal terminal 2 with laser beams (Step S3). That is, when the side portion of the metal terminal 2 is irradiated with laser beams, the back surface portion of the metal terminal 2 is heated by thermal conduction and the cream solder 3 in contact with the back surface portion is melted, whereby soldering is performed.

In this Step S3, it is desirable to supply cold air to a surface of the semiconductor part 1 on which the metal terminal 2 is not formed (for example, the top surface). For example, when the guaranteed heat resistant temperature of the semiconductor part 1 is very low, a thermal fracture may be caused by the heat which conducts from the metal terminal 2 to a package. Therefore, by supplying cold air to the package, it is possible to perform normal soldering by overheating the metal terminal 2 while keeping the package at a temperature of not more than the guaranteed heat resistant temperature.

Furthermore, it is desirable to set temperature conditions so that a difference between the heating temperature near the metal terminal 2 which is irradiated with laser beams and the package temperature near the surface to which cold air is supplied becomes within a prescribed temperature. This is because an extreme temperature difference might break the package (for example, a ceramic package).

As described above in detail, according to this embodiment, the semiconductor part 1 in which the metal terminal 2 is formed on its back surface and side surface is mounted so that only the back surface portion of the metal terminal 2 is in contact with the cream solder 3 and the soldering of the semiconductor part 1 is performed by irradiating a side surface portion of the metal terminal 2 with laser beams. Therefore, in a case where a semiconductor part 1 incapable of being passed through a reflow furnace because of a low guaranteed heat resistant temperature is to be mounted on the circuit substrate 5 in high density, it is ensured that the semiconductor part 1 can be positively soldered even onto a land 4 which is so small that the cream solder 3 can be printed only in a back side portion of the semiconductor part 1.

Incidentally, the above-described embodiment is only an example of embodiment in carrying out the present invention and it should be noted that the technical scope of the invention is not construed in a manner limited by this embodiment. That is, the present invention can be carried out in various forms without departing from the spirit of the invention or its principal features.

INDUSTRIAL APPLICABILITY

The present invention is useful in high density mounting technology for soldering a semiconductor part incapable of being passed through a reflow furnace because of a low guaranteed heat resistant temperature onto a land which is so small that it allows a solder to be printed to only a back side portion of the semiconductor part.

The invention claimed is:

1. A method of soldering a semiconductor part, the method comprising:

printing a cream solder on a land on a circuit substrate;
mounting a semiconductor part in which a metal terminal is formed on a back surface and a side surface on said cream solder so that only a back surface portion of said metal terminal is in contact with said cream solder; and
performing solder joining of said land and said semiconductor part by irradiating only a side surface portion of said metal terminal with laser beams,
wherein in said step of performing solder joining, cold air is supplied to a surface of said semiconductor part on which said metal terminal is not formed.

2. A method of soldering a semiconductor part, the method comprising:

printing a cream solder on a land on a circuit substrate;
mounting a semiconductor part in which a metal terminal is formed on a back surface and a side surface on said cream solder so that only a back surface portion of said metal terminal is in contact with said cream solder; and
performing solder joining of said land and said semiconductor part by irradiating only a side surface portion of said metal terminal with laser beams,
wherein temperature conditions are set so that a difference between a temperature near said metal terminal which is irradiated with said laser beams and a temperature near the surface to which said cold air is supplied becomes within a prescribed temperature.

3. A method of soldering a heat sensitive semiconductor part incapable of being passed through a reflow furnace to a circuit substrate, the method comprising:

printing a cream solder on a land on the circuit substrate;
providing a heat sensitive semiconductor part incapable of being passed through a reflow furnace, wherein the semiconductor part has a metal terminal formed on both a back surface portion and a side surface portion of the semiconductor part;
mounting the back surface portion of the metal terminal on said cream solder so that only the back surface portion of said metal terminal is in contact with said cream solder;
irradiating only the side surface portion of the metal terminal with a laser beam;
solder joining the land and said semiconductor part together; and
supplying cold air to a top surface of the heat sensitive semiconductor part on which the metal terminal is not formed and protecting the heat sensitive semiconductor part from a soldering heat-induced failure.

4. A method of soldering a heat sensitive semiconductor part in capable of being passed through a reflow furnace to a circuit substrate, the method comprising:

printing a cream solder on a land on the circuit substrate;
providing a heat sensitive semiconductor part incapable of being passed through a reflow furnace, wherein the semiconductor part has a metal terminal formed on both a back surface portion and a side surface portion of the semiconductor part;

mounting the back surface portion of the metal terminal on said cream solder so that only the back surface portion of said metal terminal is in contact with said cream solder;

irradiating only the side surface portion of the metal terminal with a laser beam;

solder joining the land and said semiconductor part together; and maintaining a temperature difference between the top surface of the semiconductor part and the side surface portion of the metal terminal in a prescribed range.

* * * * *